(12) United States Patent
Kim et al.

(10) Patent No.: US 7,646,665 B2
(45) Date of Patent: Jan. 12, 2010

(54) SEMICONDUCTOR MEMORY DEVICE AND BURN-IN TEST METHOD THEREOF

(75) Inventors: Dae-sun Kim, Yongin-si (KR); Jong-hyoung Lim, Hwaseong-si (KR); Sang-ki Son, Seoul (KR)

(73) Assignee: Samsung Electronics Co., Ltd. (KR)

( * ) Notice: Subject to any disclaimer, the term of this patent is extended or adjusted under 35 U.S.C. 154(b) by 202 days.

(21) Appl. No.: 12/002,930

(22) Filed: Dec. 19, 2007

(65) Prior Publication Data

US 2008/0151655 A1 Jun. 26, 2008

(30) Foreign Application Priority Data

Dec. 22, 2006 (KR) .................. 10-2006-0133026

(51) Int. Cl.
*G11C 8/00* (2006.01)
(52) U.S. Cl. .................. 365/230.06; 365/201
(58) Field of Classification Search ............ 365/230.06, 365/201

See application file for complete search history.

(56) References Cited

U.S. PATENT DOCUMENTS 5,936,899 A 8/1999 Jeong 5,986,917 A * 11/1999 Lee .............................. 365/96
6,967,880 B2 11/2005 Park
2006/0098508 A1 5/2006 Choi et al.

FOREIGN PATENT DOCUMENTS

| JP | 09-063269 | 3/1997 |
| KR | 100220950 B1 | 6/1999 |
| KR | 1999-0059131 | 7/1999 |
| KR | 100223674 B1 | 7/1999 |
| KR | 10-2003-0052396 A | 6/2003 |
| KR | 1998-034737 | 8/2005 |
| KR | 10-2006-0042702 A | 5/2006 |

* cited by examiner

*Primary Examiner*—Amir Zarabian
*Assistant Examiner*—Jason Lappas
(74) *Attorney, Agent, or Firm*—Mills & Onello, LLP (57) ABSTRACT

There are provided a semiconductor memory device and a burn-in test method thereof. A semiconductor memory device according to an aspect of the invention includes a plurality of memory cell blocks, each of which includes a plurality of memory cells that are respectively coupled to a plurality of word lines and a plurality of bit lines, a word line control unit activating word lines in memory cell blocks that correspond to row address signals and word lines in memory cell blocks that do not correspond to the row address signals, during a test operation, and a write circuit writing data in the memory cell blocks that correspond to the row address signals and not writing data in the memory cell blocks that do not correspond to the row address signals, during the test operation.

17 Claims, 7 Drawing Sheets

SEMICONDUCTOR MEMORY DEVICE AND BURN-IN TEST METHOD THEREOF

CROSS REFERENCE TO RELATED APPLICATION

This application claims priority under 35 U.S.C. 119 to Korean Patent Application No. 10-2006-0133026 filed on Dec. 22, 2006, in the Korean Intellectual Property Office, the disclosure of which is incorporated herein by reference in its entirety.

BACKGROUND OF THE INVENTION

1. Field of the Invention

The present invention relates to a semiconductor memory device and a burn-in test method thereof.

2. Description of the Related Art

During the production of semiconductor memory devices, after a manufacturing process is performed, the semiconductor memory devices are subjected to a burn-in test process in order to remove defects. The burn-in test process tests whether or not the semiconductor memory devices can operate properly, using a burn-in stress, that is, wherein an elevated voltage is applied to the semiconductor memory devices. Data is written in memory cells in order to perform the burn-in test. At this time, one or more memory cell blocks that correspond to row address signals to be input are selected, and data is written in memory cells in the selected memory cell block.

According to the related art, stress is only applied to the one or more memory cell blocks to be selected, and the other memory cell blocks enter an idle state. Therefore, efficiency during a burn-in test operation is low.

SUMMARY OF THE INVENTION

In accordance with the invention provided is a semiconductor memory device that is capable of maximizing a stress effect for the same test time.

Also in accordance with the present invention provided is a method of testing a semiconductor memory device that is capable of maximizing a stress effect for the same test time.

According to a first aspect of the present invention, there is provided a semiconductor memory device, the semiconductor memory device including a plurality of memory cell blocks, each of which includes a plurality of memory cells that are respectively coupled to a plurality of word lines and a plurality of bit lines, a word line control unit configured to activate word lines in memory cell blocks that correspond to row address signals and word lines in memory cell blocks that do not correspond to the row address signals, during a test operation, and a write circuit configured to write data in the memory cell blocks that correspond to the row address signals and to not write data in the memory cell blocks that do not correspond to the row address signals, during the test operation.

The row address signals can comprise: a first row address signal configured to select a portion of the plurality of memory cell blocks; a second row address signal configured to select main word lines in the selected memory cell blocks; and a third row address signal configured to select the word lines in the selected memory cell blocks.

The word line control unit can comprise: a first row decoder configured to receive the first row address signal and to supply block selection signals configured to for select the respective memory cell blocks; a second row decoder configured to receive the second row address signal and the respective block selection signals and to generate word line enable signals configured to activate the main word lines; a third row decoder configured to receive the third row address signal and the block selection signals and to supply word line driving signals; and a sub-word line driver configured to receive the word line enable signals and the word line driving signals and to activate the word lines.

The first row decoder can comprise: a decoding unit configured to decode the first row address signal; and a switching unit configured to output, when a test mode signal is at a first level, an output of the decoding unit as the block selection signal, and to output, when the test mode signal is at a second level, a voltage at the second level as the block selection signal.

The switching unit can comprise: a first MOS transistor enabled according to the test mode signal at the first level and configured to transmit an output of the decoding unit; and a second MOS transistor enabled according to the test mode signal at the second level and configured to pull up a voltage level of the block selection signal to the second level.

The switching unit can be an OR operator configured to receive the test mode signal and the output of the decoding unit.

The test mode signal can be a mode register set signal.

The write circuit can comprise a plurality of sense amplifiers that are coupled to the respective memory cell blocks and configured to sense data.

During a normal operation and the test operation, one portion of the sense amplifiers that correspond to the row address signals can be enabled, while another portion of the sense amplifiers that correspond to the first row address signal is not enabled.

The test can be a burn-in test.

According to a second aspect of the present invention, there is provided a semiconductor memory device, the semiconductor memory device including a plurality of memory cell blocks, each of which includes a plurality of memory cells that are respectively coupled to a plurality of word lines and a plurality of bit lines, a word line control unit configured to activate word lines in memory cell blocks that correspond to row address signals and word lines in memory cell blocks that do not correspond to the row address signals, during a burn-in test operation. The row address signals include a first row address signal configured to select a portion of the plurality of memory cells, a second row address signal configured to select main word lines in the selected memory cell blocks, and a third row address signal configured to select the word lines in the selected memory cell blocks. The word line control unit includes a first row decoder configured to receive the first row address signal and to supply block selection signals configured to select the respective memory cell blocks, a second row decoder configured to receive the second row address signal and the respective block selection signals and to generate word line enable signals configured to activate the main word lines, a third row decoder configured to receive the third row address signal and the block selection signals and to supply word line driving signals, and a sub-word line driver configured to receive the word line enable signals and the word line driving signals and to activate the word lines. The device also includes a write circuit configured to write data in the memory cell blocks that correspond to the row address signals and to not write data in the memory cell blocks that do not correspond to the row address signals, during the burn-in test operation, the write circuit including a plurality of sense amplifiers that are coupled to the respective memory cell blocks and configured to sense the data.

The first row decoder can comprise: a decoding unit configured to decode the first row address signal; and a switching unit configured to output, when a test mode signal is at a first level, an output of the decoding unit as the block selection signal, and to output, when the test mode signal is at a second level, a voltage at the second level as the block selection signal.

The switching unit can comprise: a first MOS transistor enabled according to the test mode signal at the first level and configured to transmit an output of the decoding unit; and a second MOS transistor enabled according to the test mode signal at the second level and configured to pull up a voltage level of the block selection signal to the second level.

The switching unit can be an OR operator configured to receive the test mode signal and the output of the decoding unit.

During a normal operation and the test operation, one portion of the sense amplifiers that correspond to the first row address signal can be enabled, while another portion of the sense amplifiers that correspond to the first row address signal is not enabled.

The sense amplifiers can be selectively enabled according to an output of the decoding unit.

According to a third aspect of the present invention, there is provided a method of manufacturing a semiconductor memory device. The method includes providing the semiconductor memory device to be tested, the semiconductor memory device including a plurality of memory cell blocks, each of which includes a plurality of memory cell blocks that are respectively coupled to a plurality of word lines and a plurality of bit lines. The method also includes activating word lines in memory cell blocks that correspond to row address signals and word lines in memory cell blocks that do not correspond to the row address signals, during a test operation. The method further includes writing, with a write circuit, data in the memory cell blocks that correspond to the row address signals and not writing data in the memory cell blocks that do not correspond to the row address signals, during the test operation, providing a test mode signal, receiving the row address signals and activating the word lines in all of the memory cell blocks, and writing the data in the memory cells that are coupled to the word lines in the memory cell blocks corresponding to the row address signals.

In the method, the write circuit can include a plurality of sense amplifiers that are coupled to the respective memory cell blocks and sense the data, and the writing of the data can comprise enabling a portion of the sense amplifiers that corresponds to the row address signals.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF PREFERRED EMBODIMENTS

Advantages and features of the invention and methods of accomplishing the same can be understood more readily by reference to the following detailed description of preferred embodiments and the accompanying drawings. The invention can, however, be embodied in many different forms and should not be construed as being limited to the embodiments set forth herein. Rather, these embodiments are provided so that this disclosure will be thorough and complete, but the invention will only be defined by the appended claims. Like reference numerals refer to like elements throughout the specification.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Hereinafter, aspects of the present invention will be described by explaining illustrative embodiments in accordance therewith, with reference to the attached drawings. While describing these embodiments, detailed descriptions of well-known items, functions, or configurations are typically omitted for conciseness.

Figure 1:
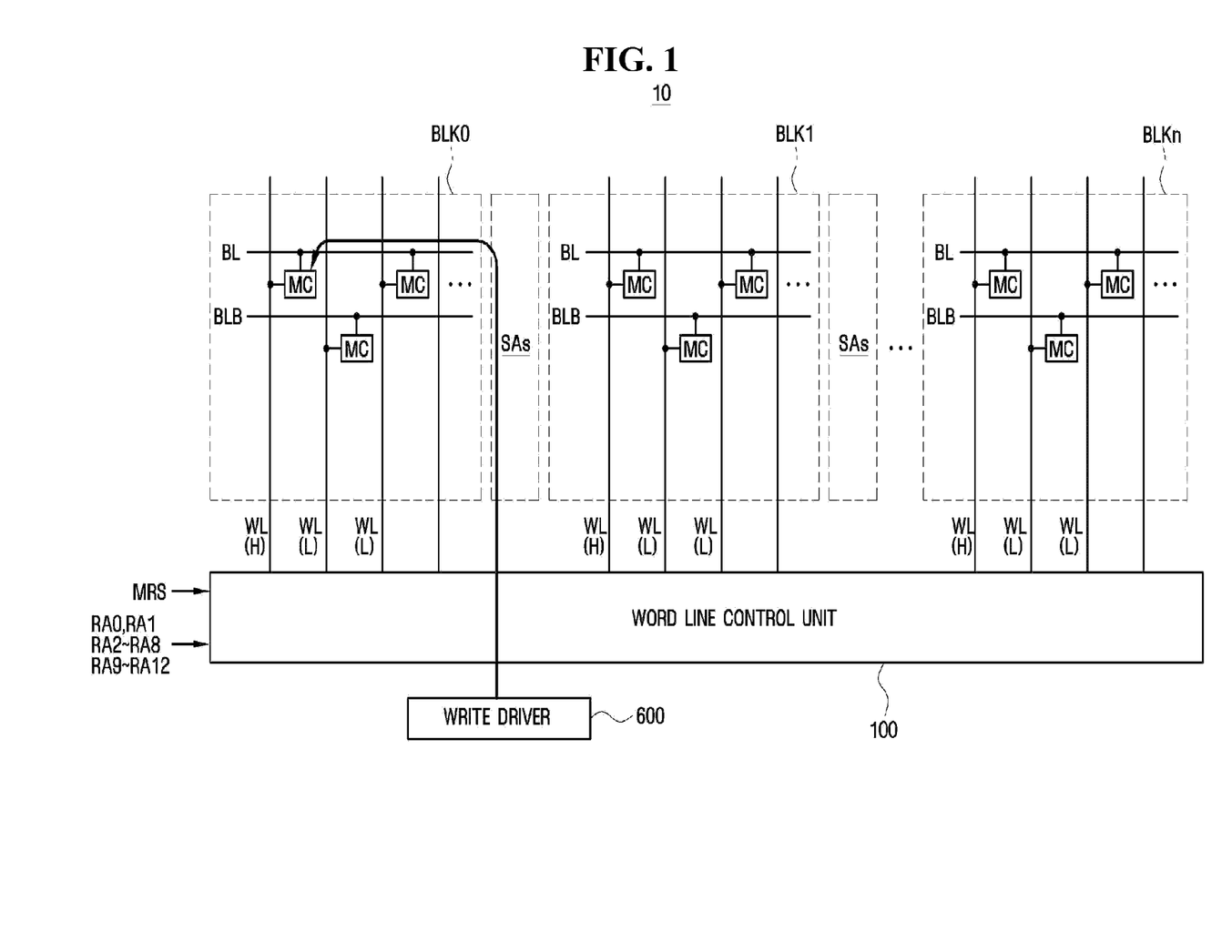
FIG. 1 is a schematic block diagram illustrating an embodiment of a semiconductor memory device and a burn-in test method thereof according to aspects of the present invention.

FIG. 1 is a schematic diagram illustrating an embodiment of a semiconductor memory device and a burn-in test method thereof according to aspects of the invention.

Referring to FIG. 1, a semiconductor memory device 10 includes a plurality of memory cell blocks BLK0 to BLKn, a write circuit, and a word line control unit 100. Each of the plurality of memory cell blocks BLK0 to BLKn includes a plurality of bit lines BL and BLB, word lines WL, and a plurality of memory cells MC that are coupled to the plurality of bit lines BL and BLB and the word lines WL. The write circuit includes a write driver 600 and sense amplifier blocks SAs.

In order to perform a burn-in test, a test mode signal MRS instructing a test mode and row address signals RA0 to RA12 are supplied to the word line control unit 100. In this case, the test mode signal MRS can be a signal that is supplied from a mode register (not shown) where a data setting an operation mode of the semiconductor memory device 10 is stored, and can be a mode register set signal. The row address signals RA0 to RA12 are signals that select memory cells MC to which data is applied. That is, the row address signals RA0 to RA12 are signals that select memory cells MC in one or more memory cell blocks BLK0 to BLKn. For example, each of the row address signals RA0 to RA12 can be a signal (H) that activates a first word line WL in the first memory cell block BLK0 of FIG. 1. Thus an activate WL is represented by (H), and a word line that has not been activated is represented by (L).

The word line control unit 100 receives the above-described test mode signal MRS and the row address signals RA0 to RA12, selects all of the memory cell blocks BLK0 to BLKn, and activates (H) the word lines WL in the respective memory cell blocks BLK0 to BLKn. For example, as shown in FIG. 1, in addition to the word lines WL in the first memory cell block BLK0 that correspond to the row address signals RA0 to RA12, the word line control unit 100 activates (H) the respective word lines WL in the other memory cell blocks BLK1 to BLKn. The row address signals RA0 to RA12 can include block selection information for selecting one or more memory cells MC and word line selection information for selecting the word lines WL in the respective memory cell blocks BLK0 to BLKn. For example, the row address signals RA0 to RA12 include first row address signals RA9 to RA12 of the block selection information, second row address signals RA2 to RA8 of main word line selection information, and third row address signals RA0 and RA1 of word line selection information. The word line control unit 100 selects all of the memory cell blocks BLK0 to BLKn regardless of the first row address signals RA9 to RA12, and activates (H) the word lines WL in the respective memory cell blocks BLK0 to BLKn in accordance with the second row address signals RA2 to RA8 of the main word line selection information and the address signals RA0 and RA1 of the word line selection information. That is, the word lines WL in all of the memory cell blocks BLK0 to BLKn are activated (H) and/or not activated (L) according to the word line selection information, and are applied with stress.

However, data for a burn-in test is written only in the memory cells MC that correspond to the row address signals RA0 to RA12. That is, data supplied from the write driver 600 is written only in the memory cells MC coupled to the first word line WL in the first memory cell block BLK0, and is not written in the memory cells MC coupled to the first word lines WL of the other memory cell blocks BLK1 to BLKn.

To perform the above-described operation, the word line control unit 100 enables only one sense amplifier 610_1 (see FIG. 2) coupled to the first memory cell block BLK0 according to the first row address signals RA9 to RA12 of the block selection information. That is, the word line control unit 100 enables only the sense amplifier 610_1 coupled to the memory cell block BLK0 that corresponds to the row address signals RA0 to RA12 so as to write the data in the memory cells MC of the memory cell block BLK corresponding to the row address signals RA0 to RA12.

The semiconductor memory device 10 writes data in the memory cells MC of the memory cell block BLK0 that corresponds to the row address signals RA0 to RA12, and does not write data in the memory cells MC of the memory cell blocks BLK1 to BLKn that do not correspond to the row address signals RA0 to RA12. However, since the semiconductor memory device 10 activates (H) or does not activate (L) the corresponding word lines WL, the memory cell blocks BLK0 to BLKn in an idle state do not exist, which maximizes a stress effect for the same test time.

Figure 2:
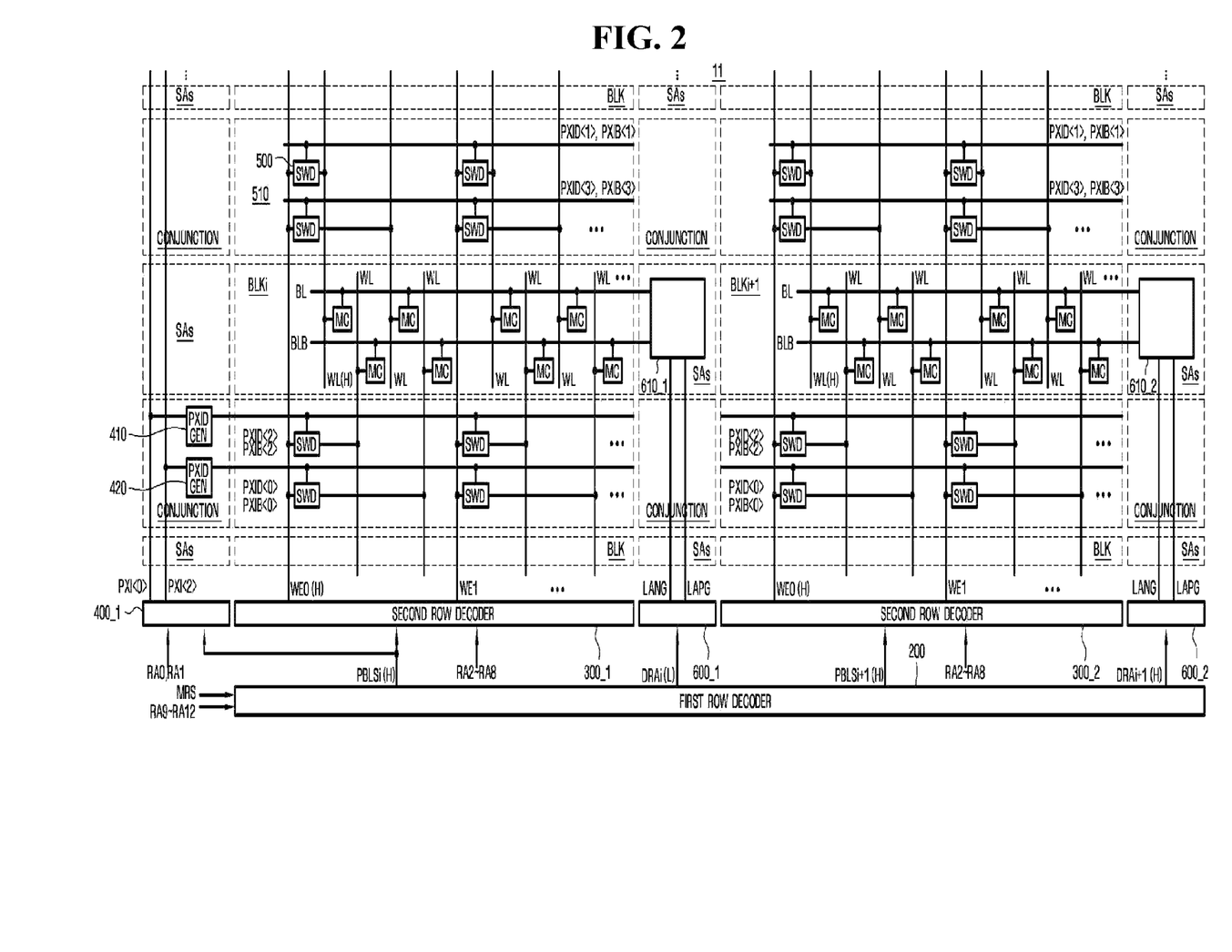
FIG. 2 is a circuit diagram illustrating an embodiment of a portion of a core structure for explaining a test operation of a semiconductor memory device according to aspects of the present invention.
Figure 3:
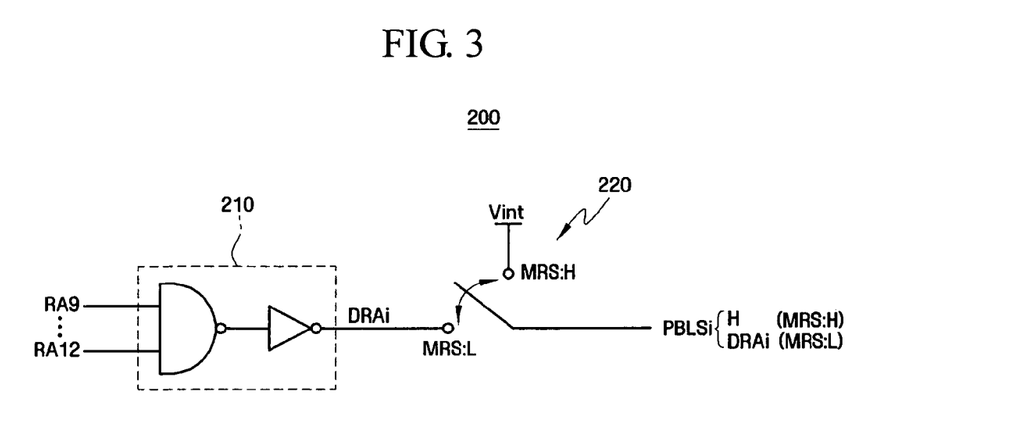
FIG. 3 is an embodiment of a circuit diagram illustrating a first row decoder of FIG. 2.
Figure 4A:
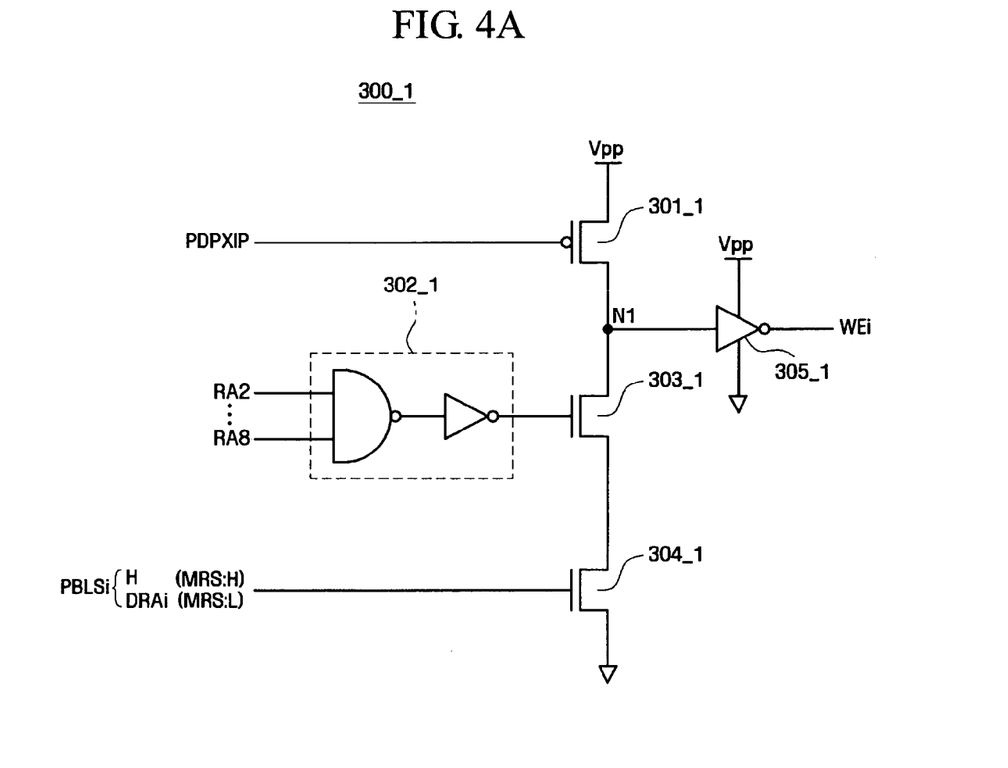
FIGS. 4A and 4B are circuit diagrams illustrating an embodiment of a second row decoder of FIG. 2.
Figure 4B:
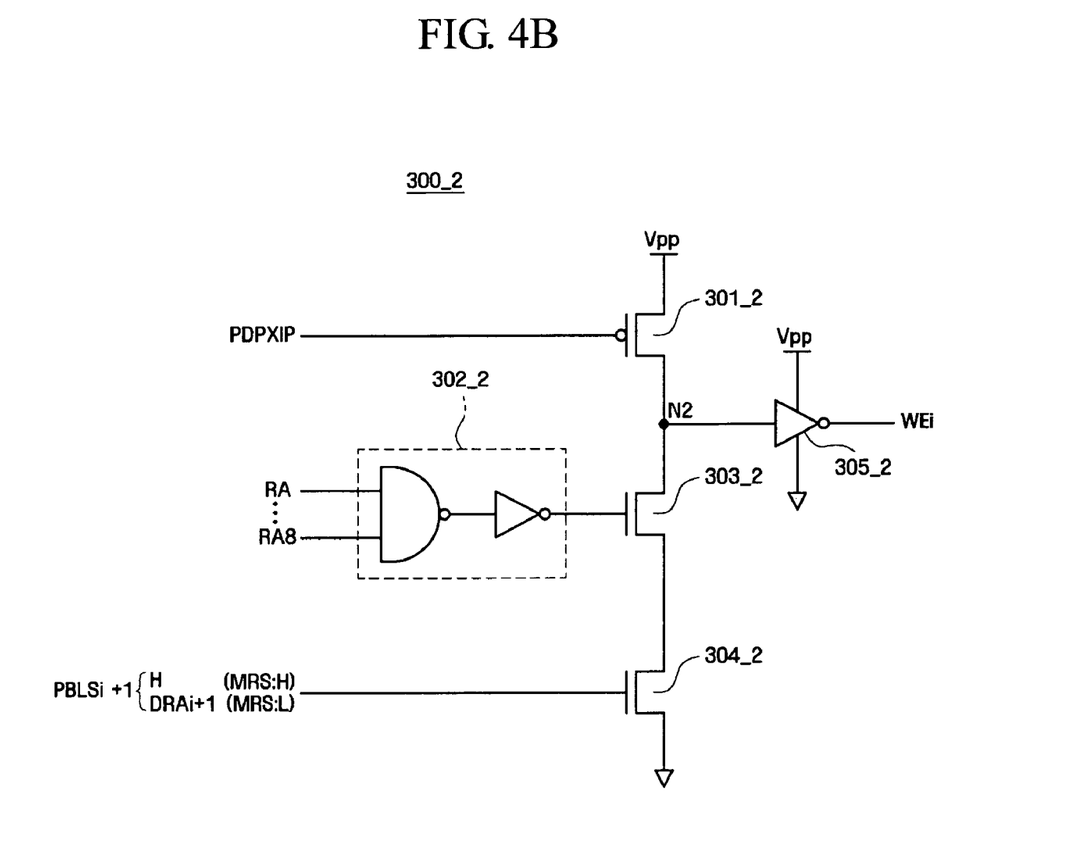
Figure 5A:
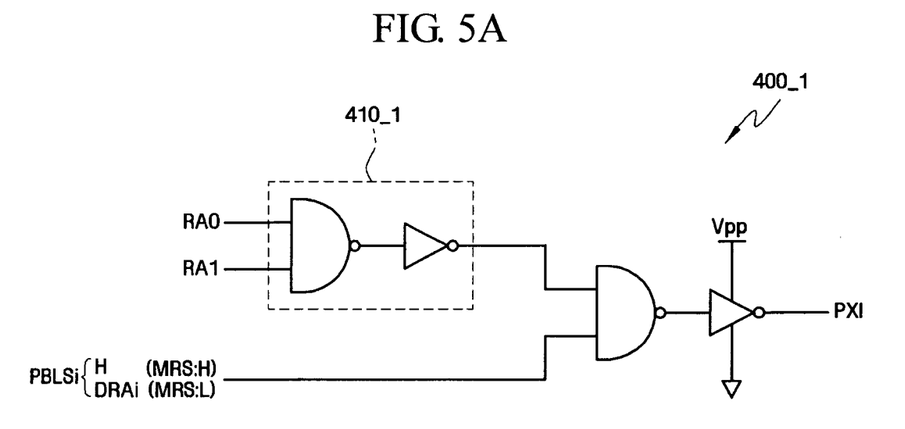
FIG. 5A is a circuit diagram illustrating an embodiment of a third row decoder of FIG. 2.
Figure 5B:
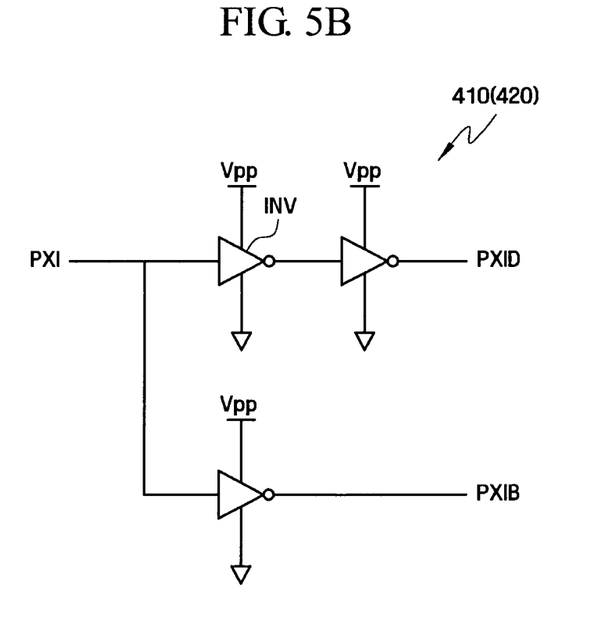
FIG. 5B is a circuit diagram illustrating an embodiment of circuits in a junction region of FIG. 2.
Figure 6:
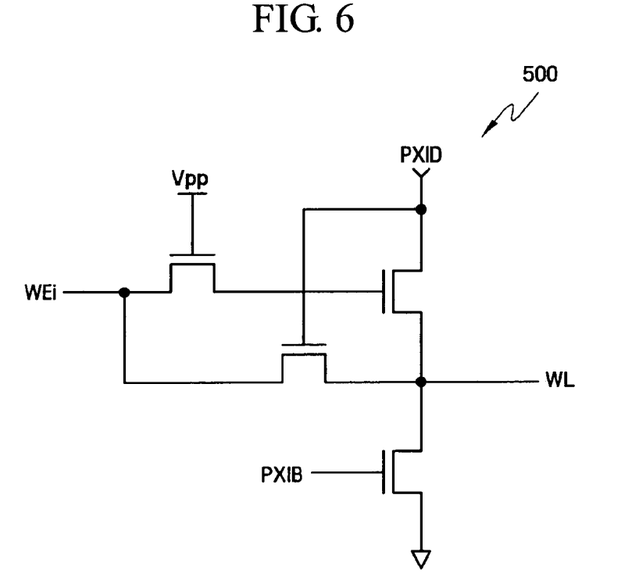
FIG. 6 is a circuit diagram illustrating an embodiment of a sub-word line driver of FIG. 2.
Figure 7:
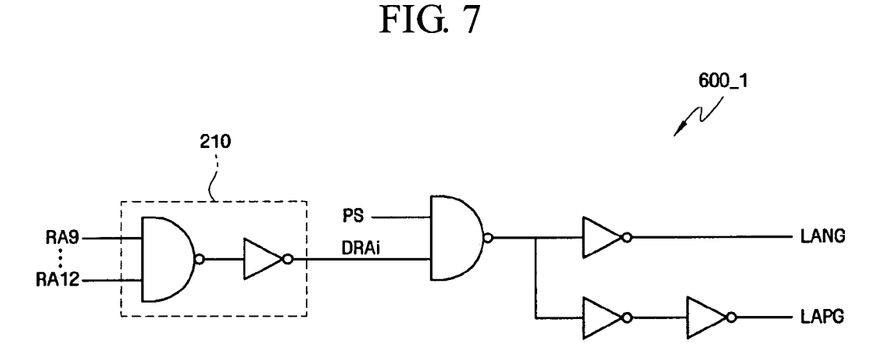
FIG. 7 is a circuit diagram illustrating an embodiment of a sense amplifier driving circuit of FIG. 2.

A semiconductor memory device and a burn-in test method thereof according to an embodiment of the invention will now be described with reference to FIGS. 2 to 7. FIG. 2 is an embodiment of a circuit diagram illustrating a portion of a core structure for explaining a test operation of a semiconductor memory device according to an aspect of the invention. FIG. 3 is a circuit diagram illustrating an embodiment of a first row decoder of FIG. 2. FIGS. 4A and 4B are circuit diagrams illustrating an embodiment of a second row decoder of FIG. 2. FIG. 5A is a circuit diagram illustrating an embodiment of a third row decoder of FIG. 2. FIG. 5B is a circuit diagram illustrating an embodiment of circuits in a junction region of FIG. 2. FIG. 6 is a circuit diagram illustrating an embodiment of a sub-word line driver of FIG. 2. FIG. 7 is a circuit diagram illustrating an embodiment of a sense amplifier driving circuit of FIG. 2.

Hereinafter, the description is given of a case where a semiconductor memory device has a sub-word line structure, and the above-described word line is referred to as a sub-word line. However, the invention is not limited such that the semiconductor memory device has the sub-word line structure. Hereinafter, the row address signals to be input are 13 bits (RA0 to RA12), and in this case, four upper bits RA9 to RA12 of the block selection information are referred to as first row address signals, seven middle bits RA2 to RA8 of the main word line selection information are referred to as second row address signals, and two lower bits RA0 and RA1 of the word line selection information are referred to as third row address signals.

First, referring to FIG. 2, a semiconductor memory device II includes memory cell blocks BLK, BLKi, and BLKi+1, a word line control unit, and a write circuit. The word line control unit (see reference numeral 100 of FIG. 1) includes a first row decoder 200, second row decoders 300_1 and 300_2, a third row decoder 400_1, and a sub-word line driver 500. As with FIG. 1, the write circuit includes sense amplifier blocks SAs and sense amplifier driving circuits 600_1 and 600_2, and each of the sense amplifier blocks SAs includes sense amplifiers 610_1 and 610_2. Further, a junction region referred to on the figures as "CONJUNCTION" can include circuits 410 and 420 that elevate a sub-word line driving signal PXI supplied from the third row decoder 400_1. For convenience of explanation, in the drawings, the third row decoder is provided only in the i-th memory cell block BLKi.

Each of the memory cell blocks BLK, BLKi, and BLKi+1 includes a plurality of memory cells MC that are respectively coupled to the plurality of sub-word lines WL and the plurality of bit lines BL and BLB. Each of the memory cells MC that are provided to correspond to intersections of the sub-word lines WL and the bit lines BL and BLB has one cell transistor (not shown) and a cell capacitor (not shown), as will be appreciated by those skilled in the art.

The first row decoder 200 receives the test mode signal MRS and the first row address signals RA9 to RA12 and outputs block selection signals PBLSi and PBLSi+1. During a normal operation, that is, if the test mode signal MRS is at a first level (L, hereinafter, referred to as "low level"), the first row decoder 200 decodes the first row address signals RA9 to RA12, and outputs the decoded result. That is, the first row decoder 200 activates block selection signals that select the memory cell blocks corresponding to the first row address signals RA9 to RA12.

During a test operation, that is, if the test mode signal MRS is at a second level (H, hereinafter, referred to as "high level"), the first row decoder 200 supplies the activated (H) block selection signals PBLSi and PBLSi+1 to the second row decoders 300_1 and 300_2 and the third row decoders 400_1. For example, even though the first row address signals RA9 to RA12 are signals that correspond to the (i+1)th memory cell block BLKi+1 in FIG. 2, if the test mode signal MRS is at a high level, all of the i-th block selection signal PBLSi and the (i+1)th block selection signal PBLSi+1 are activated (H).

However, the signals that are obtained by decoding the first row address signals RA9 to RA12 are supplied to the respective sense amplifier driving circuits 600_1 and 600_2. That is, if the first row address signals RA9 to RA12 are signals that correspond to the (i+1)th memory cell block BLKi+1, the decoded signal DRAi+1 is activated (H), but the decoded signal DRAi is not activated (L). Accordingly, the sense amplifier 610_2 that is coupled to the (i+1)th memory cell block BLKi+1 is only enabled, and data for a test is written only in the memory cells in the (i+1)th memory cell block BLKi+1 through the enabled sense amplifier 610_2.

That is, when the test operation is performed by the first row decoder 200, a memory cell block BLKi+1 that corresponds to the first row address signals RA9 to RA12 and a memory cell block BLKi that does not correspond to the first row address signals RA9 to RA12 are selected. However, the sense amplifier 610_2 that is coupled to the (i+1)th memory cell block BLKi+1 that corresponds to the first row address signals RA9 to RA12 is only enabled. An embodiment of an internal circuit of the first row decoder 200 is later described in detail with reference to FIG. 3.

With respect to FIG. 2, the second row decoders 300_1 and 300_2 receive the block selection signals PBLSi and PLBSi+1, respectively, supplied from the first row decoder 200 and the second row address signals RA2 to RA8, and output the word line enable signal WEi to the main word line. For example, the second row decoder 300_1 receives the i-th block selection signal PBLSi and the second row address signals RA2 to RA8 from the first row decoder 200 and outputs the word line enable signal WEi. The second row decoder 300_2 receives the (i+1)th block selection signal PBLSi+1 and the second row address signals RA2 to RA8 from the first row decoder 200 and outputs the word line enable signal WEi (where "i" is 0, 1, . . . in FIG. 2).

In the case where the first row address signals RA9 to RA12 are signals that correspond to the (i+1)th memory cell block BLKi+1, as described above, when the test operation is performed, the i-th block selection signal PBLSi and (i+1)th block selection signal PBLSi+1 are activated (H). Therefore, the word line enable signal WLi is activated according to the second row address signals RA2 to RA8. For example, when the second row address signals RA2 to RA8 correspond to the first main word line, the first word line enable signal WE0 is activated (H) in each of the memory cell blocks BLKi and BLKi+1, as shown in FIG. 2. Internal circuit embodiments of each of the second row decoders 300_1 and 300_2 are later described in detail with reference to FIGS. 4A and 4B.

The third row decoder 400_1 receives the block selection signal PBLSi and the third row address signals RA0 and RA1, and supplies the four word line driving signals PXI<0:3> (note only PXI<1> and PXI<2> are shown in FIG. 2). During a test operation, since the block selection signals PBLSi and PBLSi+1 are activated (H), each of the four word line driving signals PXI<0:3> is activated or not activated according to the third row address signals RA0 and RA1. The voltage of each word line driving signal PXI is elevated by circuits 410 and 420 in the junction region CONJUNCTION, and the corresponding four signals PXID<0:3> and four signals PXIB<0:3> whose voltage are elevated are supplied to the sub-word line driver 500. In FIG. 2 only PXID<0> and PXID<2> and PXIB<0> and PXID<2> are shown. The signals PXID and PXIB indicate signals that are complementary to each other (since the signals PXID and PXIB are signals that are obtained by elevating a voltage of the signal PXI, all of the signals PXID, PXIB, and PXI are hereafter referred to as word line driving signals). For example, the third row decoder 400_1 can selectively drive the four sub-word line drivers 500 according to the third row address signals RA0 and RA1. The internal circuits of the third row decoder 400_1 and the circuits 410 and 420 in the junction region CONJUNCTION are later described in detail with reference to FIGS. 5A and 5B.

Each of the sub-word line drivers 500 that are located in the sub-word line blocks 510 receives the word line enable signal WEi and the word line driving signal PXI, and activates the sub-word line WL.

For example, during a test operation, the first word line enable signal WL0 in each of the i-th memory cell block BLKi and the (i+1)th memory cell block BLKi+1 is activated (H). At this time, if the first word line driving signal PXID<1> is activated, each sub-word line driver 500 activates (H) the first word line WL. The internal circuit of the sub-word line driver 500 is later described in detail with reference to FIG. 6.

The write circuit includes sense amplifier driving circuits 600_1 and 600_2 and sense amplifiers 610_1 and 610_2.

From the first row decoder 200, the sense amplifier driving circuits 600_1 and 600_2 receive the signals DRAi and DRAi+1 obtained by decoding the first row address signals RA9 to RA12, generate the sense amplifier enable signals LANG and LAPG according to the decoded signals DRAi and DRAi+1, and supplies the generated sense amplifier enable signals to the sense amplifiers 610_1 and 610_2. Although the internal circuits of the sense amplifiers 610_1 and 610_2 are not shown, the sense amplifiers are typical sense amplifiers each including an NMOS transistor and a PMOS transistor. If the sense amplifier enable signal LANG is at a high level and the sense amplifier enable signal LAPG is at a low level, the sense amplifiers 610_1 and 610_2 are enabled. The respective sense amplifiers 610_1 and 610_2 are coupled to the respective memory cell blocks BLKi and BLKi+1. The respective sense amplifiers 610_1 and 610_2 are enabled by the sense amplifier enable signals LANG and LAPG and sense the data. For example, when the first row address signals RA9 to RA12 correspond to the (i+1)th memory cell block BLKi+1, the signal DRAi+1 is activated (H), and the signal DRAi is not activated (L). Therefore, during a normal operation and a test operation, the sense amplifier 610_2 that is coupled to the (i+1)th memory cell block BLKi+1 is only enabled, and the other sense amplifier 610_1 is disabled.

Accordingly, the data is amplified by the sense amplifier 610_2 that is coupled to the (i+1)th memory cell block BLKi+1. Then, the data is written in the memory cells MC in the (i+1)th memory cell block BLKi+1 and is not written in the memory cells MC in the i-th memory cell block BLKi. In this case, the memory cells MC where the data is written are memory cells that correspond to the row address signals RA0 to RA12.

In brief, during a test operation, when the test mode signal MRS is at a high level and the first row address signals RA9 to RA12 correspond to the (i+1)th memory cell blocks BLKi and BLKi+1, the word lines WL in the i-th memory cell block BLKi and the (i+1)th memory cell block BLKi+1 are activated. The word lines are activated according to the row address signals RA2 to RA8 and the third row address signals RA0 to RA1. However, data for a test is written only in the memory cells MC in the (i+1)th memory cell block BLKi+1 that corresponds to the row address signals RA0 to RA12. Accordingly, the stress can be applied to the respective word lines WL in the i-th memory cell block BLKi that does not correspond to the row address signals RA0 to RA12 for the same test time, which maximizes the test efficiency.

An embodiment of the first row decoder 200 of FIG. 2 will be described in detail with reference to FIG. 3.

Referring to FIG. 3, the first row decoder 200 includes a decoding unit 210 that decodes the first row address signals RA9 to RA12, and a switching unit 220 that outputs, when the test mode signal MRS is at a low level L, the output of the decoding unit 210 as the block selection signal PBLSi and outputs, when the test mode signal MRS is at a high level H, a voltage at a high level H as the block selection signal PBLS.

More specifically, each decoding unit 210 receives the first row address signals RA9 to RA12 and decodes the received signals. At this time, if the test mode signal MRS is at a low level L, that is, during a normal operation, the switching unit 220 supplies the decoded signal DRAi as a block selection signal to the second row decoders (see reference numerals 300_1 and 300_2 of FIG. 2), the third row decoders (see reference numeral 400_1 of FIG. 2), and the sense amplifier driving circuits (see reference numerals 600_1 and 600_2 of FIG. 2). During a test operation, that is, if the test mode signal MRS is at a high level H, regardless of the decoded signal DRAi, the switching unit 220 supplies an internal power supply voltage Vint at a high level H to the second row decoders (see reference numerals 300_1 and 300_2 of FIG. 2) and the third row decoder (see reference numeral 400_1 fFIG. 2). However, the switching unit 220 supplies the decoded signal DRAi to the sense amplifier driving circuits (see reference numerals 600_1 and 600_2 of FIG. 2).

Accordingly, during a test operation, the activated (H) block selection signals PBLSi and PBLSi+1 are supplied to the second row decoders (see reference numerals 300_1 and 300_2 of FIG. 2) and the third row decoder (see reference numeral 400_1 of FIG. 2), and the activated decoded signal DRAi is supplied to the sense amplifier driving circuits (see reference numerals 600_1 and 600_2 of FIG. 2) when only coupled to the memory cell blocks that are selectively activated according to the first row address signals RA9 to RA12.

The second row decoders 300_1 and 300_2 of FIG. 2 will be described in detail with reference to FIGS. 4A and 4B.

Referring to FIGS. 4A and 4B, the second row decoders 300_1 and 300_2 respectively includes PMOS transistors 301_1 and 301_2 that respond to a precharge signal PDPXIP; decoding units 302_1 and 302_2 that decode the second row address signals RA2 to RA8; NMOS transistors 303_1 and 304_1 (connected in series), 303_2, and 304_2 (connected in series) that respond to outputs of the decoding units 302_1 and 302_2; block selection signals PBLSi and PBLSi+1; and inverters 305_1 and 305_2 that respond to nodes N1 and N2 between the PMOS transistors 301_1 and 301_2 and the NMOS transistors 303_1 and 303_2. The output of each of the inverters 305_1 and 305_2 becomes a word line enable signal WEi that activates a main word line.

It is assumed that in an initial state, a voltage at the nodes N1 and N2 is at an elevated voltage Vpp by the precharge signal PDPXIP and the first row address signals RA9 to RA12 correspond to the (i+1)th memory cell block BLKi+1 (that is, the decoded signal DRAi+1 is at a high level and the decoded signal DRAi is at a low level). During a normal operation, that is, if the test mode signal MRS is at a low level L, the NMOS transistor 304_1 that receives an i-th block selection signal PBLSi of FIG. 4A is disabled and outputs a non-activated word line enable signal WEi. If the NMOS transistor 304_2 that receives the (i+1)th block selection signal PBLSi+1 of FIG. 4B is enabled and the NMOS transistor 303_2 that receives the output of the decoding unit 302_2 is enabled, a voltage at the node N2 is pulled down to a ground voltage and the activated word line enable signal WEi is output.

Different from the normal operation, during a test operation, that is, if the test mode signal MRS is at a high level H, the i-th block selection signal PBLSi and the (i+1)th block selection signal PBLSi+1 are activated (H). As a result, the NMOS transistors 304_1 and 304_2 are enabled. When the second row address signals RA2 to RA8 that select the first main word line are decoded, the NMOS transistors 303_1 and 303_2 are enabled. As a result, a voltage at the nodes N1 and N2 is pulled down to a ground voltage, and the word line enable signals WEi of FIGS. 4A and 4B are activated.

However, the internal circuits of the second row decoders 300_1 and 300_2 are not limited to the structures of FIGS. 4A and 4B, and can be a different type of circuit operated by the block selection signal and the row address signal as a circuit that generates the word line enable signal WEi.

Referring to FIGS. 5A and 5B, embodiments of the third row decoder 400_1 of FIG. 2 and the circuits 410 and 420 in the junction region CONJUNCTION will be described in detail.

Referring to FIG. 5A, the third row decoder receives the third row address signals RA0 and RA1 and decodes them, and receives the decoded signal and the block selection signal PBLSi and outputs the word line driving signal PXI.

During a normal operation, that is, if the test mode signal MRS is at a low level L, since the signal obtained by decoding the first row address signals RA9 to RA12 by the first row decoder (see FIG. 3) becomes a block selection signal PBLSi, the block selection signal PBLSi is activated or not activated according to the first row address signals RA9 to RA12, and when the block selection signal PBLSi is not activated, all of the word line driving signals (PXI<0:3>) are not activated.

During a test operation, that is, if the test mode signal MRS is at a high level H, since the activated (H) block selection signal PBLSi is supplied from the first row decoder (see FIG.

3), the four word line driving signals PXI<0:3> are activated or not activated according to the row address signals RA0 and RA1.

Referring to FIG. 5B, the embodiments of circuits 410 and 420 in the junction region CONJUCTION include inverters INV, and elevates a voltage of the word line driving signals PXI and supplies to the sub-word line driver 500, the signals PXID and PXIB whose voltages are elevated.

An embodiment of the sub-word line driver 500 of FIG. 2 will be described in detail with reference to FIG. 6.

Referring to FIG. 6, the sub-word line driver 500 shown in FIG. 6 is supplied with the word line driving signals PXID and PXIB and the word line enable signal WEi, and activates the word line WL. However, an internal circuit of the sub-word line driver 500 is not limited to the circuit shown in FIG. 6, and can be modified in various types.

An embodiment of the sense amplifier driving circuit 600_1 of FIG. 2 will be described in detail with reference to FIG. 7.

Referring to FIG. 7, the sense amplifier driving circuit 600_1 receives a sense enable signal PS and the decoded signal DRAi output by the decoding unit (see reference numeral 210 of FIG. 3) of the first row decoder, and outputs the sense amplifier enable signals LANG and LAPG. In this case, the decoded signal DRAi is activated or not activated according to the first row address signals RA9 to RA12. For example, when the first row address signals RA9 to RA12 are signals that correspond to the (i+1)th memory cell block BLKi+1, the decoded signal DRAi is not activated. Therefore, the sense amplifier (see reference numeral 610_1 of FIG. 2) that is coupled to the i-th memory cell block BLKi is disabled, and the sense amplifier (see reference numeral 610_2 of FIG. 2) that is coupled to the (i+1)th memory cell block BLKi+1 is enabled.

An embodiment of a first row decoder of a semiconductor memory device according to another aspect of the invention will be described with reference to the circuit diagram of FIG. 8 The constituent elements that perform the same functions as the constituent elements shown in FIG. 3 are denoted by the same reference numerals, and the description thereof will be omitted, for convenience.

Figure 8:
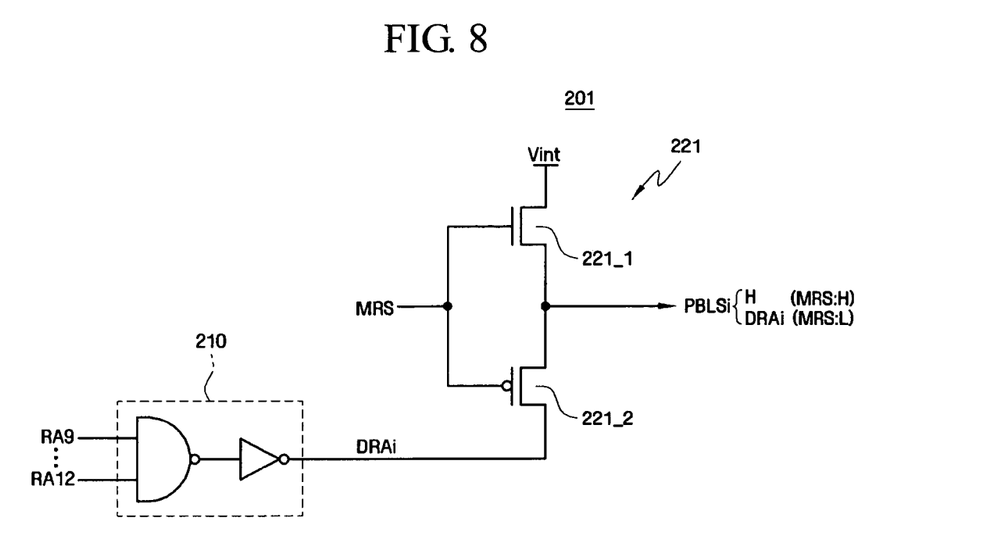
FIG. 8 is a circuit diagram illustrating an embodiment of a first row decoder of a semiconductor memory device according to another embodiment of the invention.

Referring to FIG. 8, the embodiment of a first row decoder 201 of a semiconductor memory device includes a decoding unit 310 and a switching unit 221. The switching unit 221 includes a first MOS transistor 221_1 that is enabled according to a test mode signal MRS at a low level L and transmits an output DRAi of the decoding unit 210 as a block selection signal PBLSi, and a second MOS transistor 221_2 that is enabled according to the test mode signal MRS at a high level H and pulls up a voltage of the block selection signal PBLSi to an internal power supply voltage Vint at a high level. In this case, the first MOS transistor 221_1 can be composed of an NMOS transistor and the second MOS transistor 221_2 can be composed of a PMOS transistor.

Figure 9:
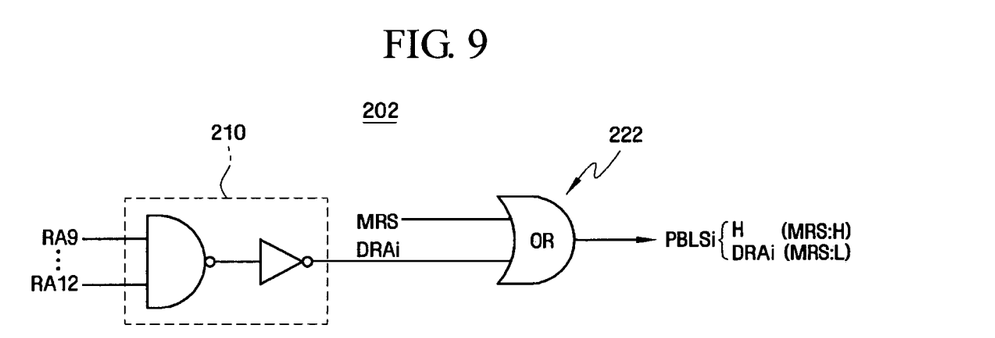
FIG. 9 is a circuit diagram illustrating an embodiment of a first row decoder of a semiconductor memory device according to still another embodiment of the invention.

FIG. 9 is a diagram illustrating an embodiment of a first row decoder of a semiconductor memory device according to still another aspect of the invention. The constituent elements that perform the same functions as the constituent elements shown in FIG. 8 are denoted by the same reference numerals and the description thereof will be omitted, for convenience.

Referring to FIG. 9, the embodiment of a first row decoder 202 includes a decoding unit 210 and a switching unit 222. The switching unit 222 includes an OR operator. When a test mode signal MRS is at a high level H, the switching unit 222 outputs a block selection signal PBLSi at a high level H, and when the test mode signal MRS is at a low level L, the switching unit 222 outputs the output DRAi of the decoding unit 210 as the block selection signal PBLSi.

According to the semiconductor device and the burn-in test method thereof according to the embodiments of the invention, during a test operation, the word lines in the memory cell blocks that do not correspond to the row address signals are also activated. At this time, data for a test is written only in the memory cells in the memory cell blocks that correspond to the row address signals. Accordingly, stress can be applied to the respective word lines in the memory cell blocks that do not correspond to the row address signals for the same test time, which maximizes test efficiency.

Although embodiments in accordance with the invention have been described in connection with the accompanying drawings, it will be apparent to those skilled in the art that various modifications and changes can be made thereto without departing from the scope and spirit of the invention. Therefore, it should be understood that the above embodiments are not limitative, but illustrative in all aspects. It is intended by the following claims to claim that which is literally described and all equivalents thereto, including all modifications and variations that fall within the scope of each claim.

What is claimed is:

1. A semiconductor memory device comprising:
a plurality of memory cell blocks, each of which includes a plurality of memory,
cells that are respectively coupled to a plurality of word lines and a plurality of bit lines;
a word line control unit configured to activate word lines in memory cell blocks that correspond to row address signals and word lines in memory cell blocks that do not correspond to the row address signals, during a test operation, wherein the word line control unit comprises:
a first row decoder configured to receive a first row address signal and to supply block selection signals configured to select the respective memory cell blocks;
a second row decoder configured to receive a second row address signal and the respective block selection signals and to generate word line enable signals configured to activate the main word lines:
a third row decoder configured to receive a third row address signal and the block selection signals and to supply word line driving signals; and
a sub-word line driver configured to receive the word line enable signals and the word line driving signals and to activate the word lines; and
a write circuit configured to write data in the memory cell blocks that correspond to the row address signals and to not write data in the memory cell blocks that do not correspond to the row address signals, during the test operation.

2. The semiconductor memory device of claim 1, wherein the row address signals comprise:
the first row address signal configured to select a portion of the plurality of memory cell blocks;
the second row address signal configured to select main word lines in the selected memory cell blocks; and
the third row address signal configured to select the word lines in the selected memory cell blocks.

3. The semiconductor memory device of claim 1, wherein the first row decoder comprises:
a decoding unit configured to decode the first row address signal; and a switching unit configured to output, when a test mode signal is at a first level, an output of the decoding unit as the block selection signal, and to output, when the test mode signal is at a second level, a voltage at the second level as the block selection signal.

4. The semiconductor memory device of claim 3, wherein the switching unit comprises:
a first MOS transistor enabled according to the test mode signal at the first level and configured to transmit an output of the decoding unit; and a second MOS transistor enabled according to the test mode signal at the second level and configured to pull up a voltage level of the block selection signal to the second level.

5. The semiconductor memory device of claim 3, wherein the switching unit is an OR operator configured to receive the test mode signal and the output of the decoding unit.

6. The semiconductor memory device of claim 3, wherein the test mode signal is a mode register set signal.

7. The semiconductor memory device of claim 1, wherein the write circuit comprises a plurality of sense amplifiers that are coupled to the respective memory cell blocks and configured to sense data.

8. The semiconductor memory device of claim 7, wherein during a normal operation and the test operation, some sense amplifiers that correspond to the row address signals are enabled, while the other that do not correspond to the row address signal are not enabled.

9. The semiconductor memory device of claim 1, wherein the test is a burn-in test.

10. A semiconductor memory device comprising:
a plurality of memory cell blocks, each of which includes a plurality of memory cells that are respectively coupled to a plurality of word lines and a plurality of bit lines;
a word line control unit configured to activate word lines in memory cell blocks that correspond to row address signals and word lines in memory cell blocks that do not correspond to the row address signals, during a burn-in test operation, the row address signals including a first row address signal configured to select a portion of the plurality of memory cells, a second row address signal configured to select main word lines in the selected memory cell blocks, and a third row address signal configured to select the word lines in the selected memory cell blocks, the word line control unit including:
a first row decoder configured to receive the first row address signal and to supply block selection signals configured to select the respective memory cell blocks,
a second row decoder configured to receive the second row address signal and the respective block selection signals and to generate word line enable signals configured to activate the main word lines,
a third row decoder configured to receive the third row address signal and the block selection signals and to supply word line driving signals, and
a sub-word line driver configured to receive the word line enable signals and the word line driving signals and to activate the word lines; and
a write circuit configured to write data in the memory cell blocks that correspond to the row address signals and not to write data in the memory cell blocks that do not correspond to the row address signals, during the burn-in test operation, the write circuit including a plurality of sense amplifiers that are coupled to the respective memory cell blocks and configured to sense the data.

11. The semiconductor memory device of claim 10, wherein the first row decoder comprises:
a decoding unit configured to decode the first row address signal; and
a switching unit configured to output, when a test mode signal is at a first level, an output of the decoding unit as the block selection signal, and to output, when the test mode signal is at a second level, a voltage at the second level as the block selection signal.

12. The semiconductor memory device of claim 11, wherein the switching unit comprises:
a first MOS transistor enabled according to the test mode signal at the first level and configured to transmit an output of the decoding unit; and
a second MOS transistor enabled according to the test mode signal at the second level and configured to pull up a voltage level of the block selection signal to the second level.

13. The semiconductor memory device of claim 11, wherein the switching unit is an OR operator configured to receive the test mode signal and the output of the decoding unit.

14. The semiconductor memory device of claim 11, wherein during a normal operation and the test operation, some sense amplifiers that correspond to the first row address signal are enabled, while the other that do not correspond to the first row address signal are not enabled.

15. The semiconductor memory device of claim 14, wherein the sense amplifiers are selectively enabled according to an output of the decoding unit.

16. A burn-in test method of a semiconductor memory device, the method comprising:
providing the semiconductor memory device to be tested, the semiconductor memory device including a plurality, of memory cell blocks, each of which includes a plurality of memory cells that are respectively coupled to a plurality of word lines and a plurality of bit lines;
activating, with a word line control unit, word lines in memory cell blocks that correspond to row address signals and word lines in memory cell blocks that do not correspond to the row address signals, during a test operation, the wordline control unit comprising:
a first row decoder configured to receive the first row address signal and to supply block selection signals configured to select the respective memory cell blocks;
a second row decoder configured to receive the second row address signal and the respective block selection signals and to generate word line enable signals configured to activate the main word lines;
a third row decoder configured to receive the third row address signal and the block selection signals and to supply word line driving signals; and
a sub-word line driver configured to receive the word line enable signals and the word line driving signals and to activate the word lines;
writing, with a write circuit, data in the memory cell blocks that correspond to the row address signals and not writing data in the memory cell blocks that do not correspond to the row address signals, during the test operation;
providing a test mode signal;
receiving the row address signals and activating the word lines in all of the memory cell blocks; and
writing the data in the memory cells that are coupled to the word lines in the memory cell blocks corresponding to the row address signals.

17. The method of claim 16, wherein:
the write circuit includes a plurality of sense amplifiers that are coupled to the respective memory cell blocks and sense the data, and
the writing of the data comprises enabling a portion of the sense amplifiers that corresponds to the row address signals.

* * * * *

UNITED STATES PATENT AND TRADEMARK OFFICE
CERTIFICATE OF CORRECTION

PATENT NO. : 7,646,665 B2  Page 1 of 1
APPLICATION NO. : 12/002930
DATED : January 12, 2010
INVENTOR(S) : Dae-sun Kim et al.

It is certified that error appears in the above-identified patent and that said Letters Patent is hereby corrected as shown below:

Column 12, line 23, please remove ",".
Column 12, line 37, please remove ":" and insert --;--

Signed and Sealed this

First Day of June, 2010

David J. Kappos
*Director of the United States Patent and Trademark Office*